(12) United States Patent
Narushima et al.

(10) Patent No.: US 11,598,023 B2
(45) Date of Patent: Mar. 7, 2023

(54) LOW RESISTIVITY WAFER AND METHOD OF MANUFACTURING THEREOF

(71) Applicant: SUMCO CORPORATION, Tokyo (JP)

(72) Inventors: Yasuhito Narushima, Omura (JP); Masayuki Uto, Omura (JP)

(73) Assignee: SUMCO CORPORATION, Tokyo (JP)

(*) Notice: Subject to any disclaimer, the term of this patent is extended or adjusted under 35 U.S.C. 154(b) by 228 days.

(21) Appl. No.: 16/915,095

(22) Filed: Jun. 29, 2020

(65) Prior Publication Data

US 2021/0404087 A1 Dec. 30, 2021

(51) Int. Cl.
*H01L 29/167* (2006.01)
*C30B 29/06* (2006.01)
*C30B 15/30* (2006.01)
*C30B 15/04* (2006.01)

(52) U.S. Cl.
CPC .............. *C30B 29/06* (2013.01); *C30B 15/04* (2013.01); *C30B 15/30* (2013.01); *H01L 29/167* (2013.01)

(58) Field of Classification Search
CPC .................................. C30B 29/06; H01L 51/56
See application file for complete search history.

(56) References Cited

U.S. PATENT DOCUMENTS

| | | | |
|---|---|---|---|
| 5,985,363 A * | 11/1999 | Shiau | H01L 21/312 427/407.1 |
| 8,888,911 B2 | 11/2014 | Uto et al. | |
| 2005/0218501 A1* | 10/2005 | Naito | H01L 23/564 438/622 |
| 2009/0314996 A1 | 12/2009 | Kawazoe et al. | |

FOREIGN PATENT DOCUMENTS

| | | | |
|---|---|---|---|
| JP | H11-135586 A | 5/1999 | |
| JP | 2008-024547 A | 2/2008 | |
| JP | 2011-057476 A | 3/2011 | |
| WO | WO-2010146853 A1 * | 12/2010 | ............. C30B 15/22 |

OTHER PUBLICATIONS

First Office Action issued in JP Patent Application No. 2021-106674, dated Aug. 16, 2022, translation.

* cited by examiner

*Primary Examiner* — Caleb E Henry
(74) *Attorney, Agent, or Firm* — Greenblum & Bernstein, P.L.C.

(57) ABSTRACT

A semiconductor wafer including a single crystal doped with a dopant, wherein a resistivity of the wafer is 0.7 mΩ-cm or less, and wherein a striation height of the wafer is 6 mm or more. The resistivity of the wafer may be 0.8 mΩ-cm or less, and the striation height may be 13 mm or more. The resistivity of the wafer may be 0.7 mΩ-cm or less, and the striation may be 22 mm or more. Example features relate to a method of making a semiconductor wafer that includes adding a dopant to a silicon melt, rotationally pulling a crystal from the silicon melt, and applying a magnetic field of 3000 G or more such that the semiconductor wafer has a resistivity that is equal to or less than 0.8 mΩ-cm and a striation height that is equal to or more than 13 mm.

10 Claims, 15 Drawing Sheets

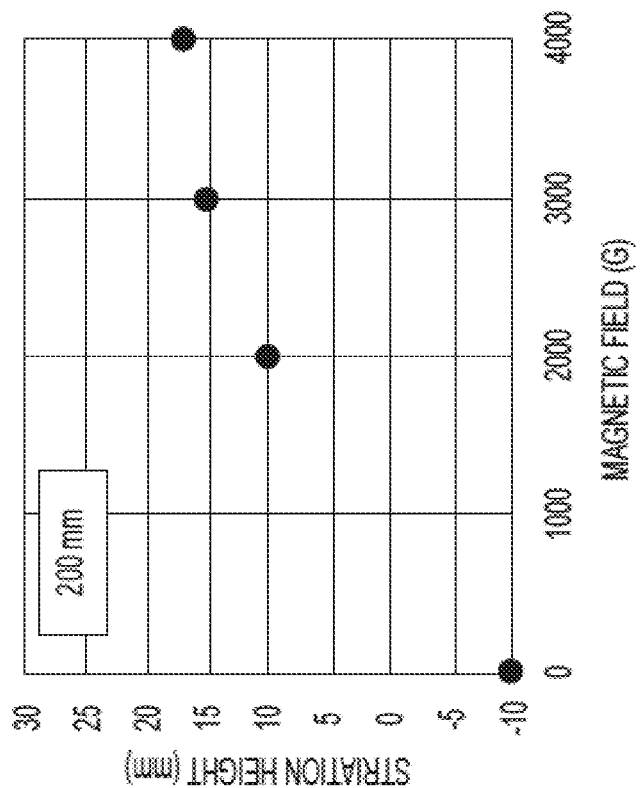
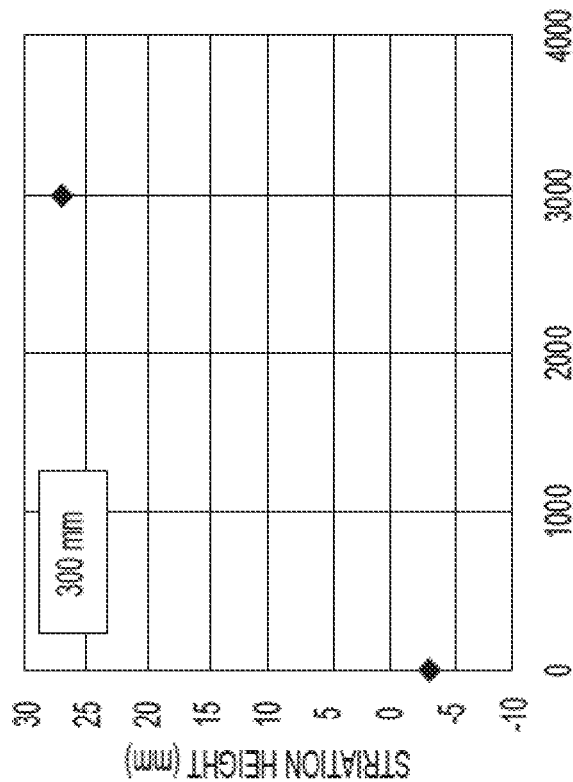

LOW RESISTIVITY WAFER AND METHOD OF MANUFACTURING THEREOF

BACKGROUND OF THE DISCLOSURE

1. Field of the Disclosure

The present disclosure relates to a wafer having low resistivity, and a method of manufacturing a wafer.

2. Description of Related Art

Wafers are thin slices of semiconductor, such as a monocrystalline silicon or a single-crystal silicon, generally used for the fabrication of integrated circuits, power devices or, in photovoltaics, to manufacture solar cells. A wafer serves as the substrate for microelectronic devices built in and upon the wafer, and undergoes many microfabrication processes, such as doping, ion implantation, etching, thin-film deposition of various materials, and photolithographic patterning. Finally, the individual microcircuits are separated by wafer dicing and packaged as an integrated circuit.

Properties of the wafer have an impact on the resulting microcircuits and other semiconductor devices. Accordingly, improving properties of the wafer may improve the performance of the resulting semiconductor device or circuit. For example, when a wafer has low resistivity, the resulting semiconductor device or circuit consumes less power and is desirable for use in mobile devices. When a silicon crystal to be sliced into wafers exhibits abnormal growth, such failure of crystallinity destroys the semiconductor properties of the material. The deformed crystal must then be discarded.

FIG. 1 is a schematic cross-sectional view illustrating a known relationship between the resistivity of a wafer and the dopant concentration of the wafer. The curve illustrated in FIG. 1 is referred to as the Irvin Curve, and is obtained via ASTM F723-81. FIG. 1 describes the relationship between the resistivity R and the dopant (carrier) concentration (in atoms/cm$^3$). In the case illustrated in FIG. 1, two curves are illustrated, each curve corresponding to a different dopant. The lower curve describes the resistivity as a function of the concentration of phosphorus, and the upper curve describes the resistivity as a function of the concentration of boron. Among other reasons, phosphorus is used to negatively charge (N-type), and boron to positively charge (P-type), a wafer. As illustrated in FIG. 1, in both cases, the resulting resistivity is generally inversely proportional to the dopant concentration. For an equal concentration of dopant, the resistivity for the phosphorous-doped wafer is lower than the resistivity of the boron-doped wafer. In order to obtain as low a resistivity as possible without disrupting the structural and electrical integrity of the wafer, a higher dopant concentration may be advantageous.

FIG. 2 is a cross-sectional view of a crystal ingot formed during a known manufacturing process of a silicon single crystal from a silicon melt. It is known that if the dopant concentration of the silicon melt is increased, the resulting resistivity of the silicon ingot pulled from the silicon melt decreases, but if the dopant concentration of the silicon melt is too high, then the silicon ingot pulled from the silicon melt may exhibit abnormal growth such as, e.g., cellular dendrites growth. That is, if too much dopant is present in the silicon melt, the silicon crystal ingot may deform and destroy its crystallinity. The following table (Table 1) provides experimental data describing the effects of dopant concentration on resistivity and abnormal growth of a silicon ingot.

TABLE 1

The dopant is phosphorus (P), the striation height is 4 mm, and the pull speed is 0.4 mm/min, for a 200 mm wafer.

| Striation Height (mm) | Pull Speed (mm/min) | Resistivity (mΩ-cm) | Dopant Concentration (atoms/cm$^3$) | Abnormal Growth |
|---|---|---|---|---|
| 4 | 0.4 | 0.84 | $9.0 \times 10^{19}$ | NO |
| 4 | 0.4 | 0.82 | $9.2 \times 10^{19}$ | NO |
| 4 | 0.4 | 0.8 | $9.5 \times 10^{19}$ | NO |
| 4 | 0.4 | 0.78 | $9.7 \times 10^{19}$ | YES |

Based on the above data, abnormal growth occurs when the dopant concentration reaches $9.7 \times 10^{19}$ atoms/cm$^3$. It follows that, at these growing conditions, a maximum dopant concentration is about $9.5 \times 10^{19}$ atoms/cm$^3$ for achieving a minimum resistivity of 0.8 mil-cm before abnormal growth is noted.

Incidentally, different dopants reflect different effectiveness in lowering resistivity in wafers. FIGS. 4A and 4B compare two known dopants with respect to their effectiveness for lowering resistivity in 150 mm wafers. In FIGS. 4A and 4B, wafers are doped with antimony (Sb) and arsenic (As), respectively. Both wafers have striation heights of 3 mm and were taken from crystals pulled at 0.7 mm/min. FIGS. 4A and 4B show that arsenic is more effective in lowering resistivity without forming abnormal growth. Here the arsenic (FIG. 4B) results in a minimum resistivity of about 1.5 mil-cm before abnormal growth occurs compared to 9.0 mil-cm for antimony (FIG. 4A).

During the manufacturing process of a single-crystal silicon wafer, striation takes place on the surface of the wafer as viewed in cross-section as a result of, e.g., pulling speed of the single crystal from the melt during the manufacturing process of the silicon single crystal. Striation height for a silicon ingot can be measured as discussed in U.S. Pat. No. 8,888,911, which is incorporated herein by reference in its entirety.

SUMMARY OF THE DISCLOSURE

In view of the challenges noted above, example features of the present disclosure provide a wafer having a previously unachievably low resistivity. This result may be achieved by modulating a desired amount of dopant in the molten silicon from which a single crystal grows to provide wafers. Example features also include a wafer having a low resistivity with a desired striation height.

Example features include a semiconductor wafer including a dopant, having a resistivity that is equal to or less than 0.7 mΩ-cm, and a striation height that is equal to or more than 6 millimeters (mm). Example features include a semiconductor wafer including phosphorus as a dopant. Example features include a semiconductor wafer having a diameter of about 200 mm.

Example features include a semiconductor wafer having a resistivity that is equal to or less than 0.5 mΩ-cm.

Example features include a semiconductor wafer including a dopant, having a resistivity equal to or less than 0.8 mΩ-cm, and a striation height that is equal to or more than 13 millimeters (mm). Example features include a semiconductor wafer including phosphorus as a dopant. Example features include a semiconductor wafer having a diameter of about 300 mm.

Example features include a semiconductor wafer including a dopant, having a resistivity that is equal to or less than 0.7 mΩ-cm, and a striation height that is equal to or more than 22 millimeters (mm). Example features include a semiconductor wafer including phosphorus as a dopant. Example features include a semiconductor wafer having a diameter of about 300 mm.

Example features include a semiconductor wafer including a dopant, having a resistivity that is equal to or less than 1.6 mΩ-cm, and a striation height that is equal to or more than 13 millimeters (mm). Example features include a semiconductor wafer including arsenic as a dopant. Example features include a semiconductor wafer having a diameter of about 300 mm.

Example features include a method of manufacturing a semiconductor wafer that includes adding a dopant to a silicon melt, rotationally pulling a crystal from the silicon melt, and applying a magnetic field to the silicon melt during the pulling, the magnetic field being equal to or greater than 3000 Gauss (G) (0.3 Tesla (T)). In example features, the resistivity of the semiconductor wafer cut from the crystal is equal to or less than 0.8 mΩ-cm, and a striation height that is equal to or more than 13 mm. Example features include a manufactured wafer having a diameter that is equal to about 300 mm.

Example features include a method of manufacturing a semiconductor wafer, wherein the dopant added to the silicon melt is phosphorus. Example features include a method of manufacturing a semiconductor wafer that includes applying pressure to the silicon melt (hereinafter "grower pressure") in order to reduce or suppress evaporation of the dopant. In example features, the grower pressure is applied via the application of a gas, such as, e.g., argon.

According to example features of the present disclosure, a wafer can be obtained by the method described above in which a wafer has a desired dopant, a desired resistivity and a desired striation height to achieve desired performance.

BRIEF DESCRIPTION OF THE DRAWINGS

Example features of the present disclosure are further described in the detailed description which follows, in reference to the noted plurality of drawings by way of non-limiting example features of the present disclosure, in which like reference numerals represent similar parts throughout the several views of the drawings, and wherein:

FIGS. 8A and 8B illustrate a relationship between the magnetic field applied during a manufacturing process of a silicon single-crystal wafer and the resulting striation height according to example features;

DETAILED DESCRIPTION OF THE DISCLOSURE

Figure 1:
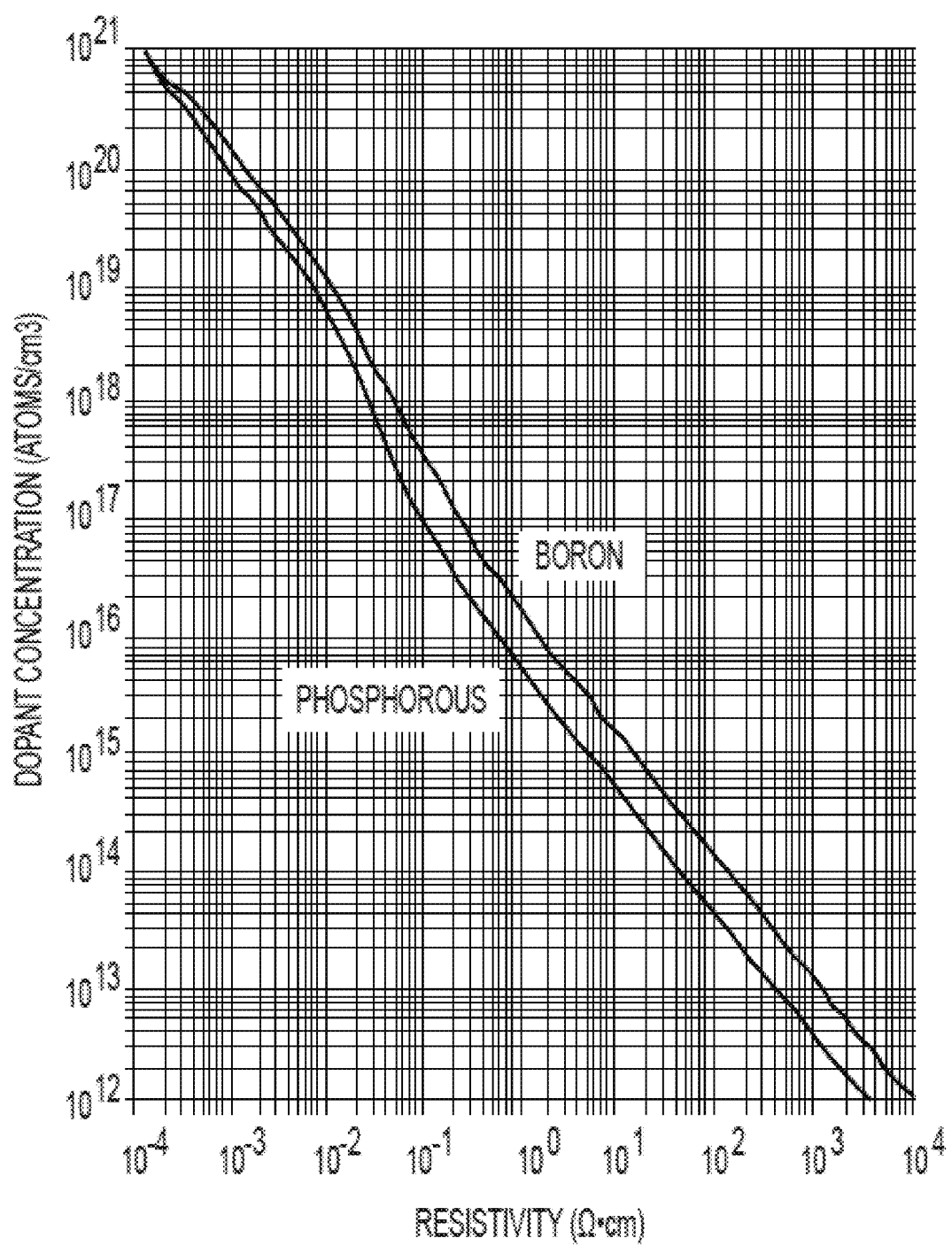
FIG. 1 is a schematic cross-sectional view illustrating a relationship between the resistivity of a wafer and the dopant concentration of the wafer, according to example features of the present disclosure.
Figure 2:
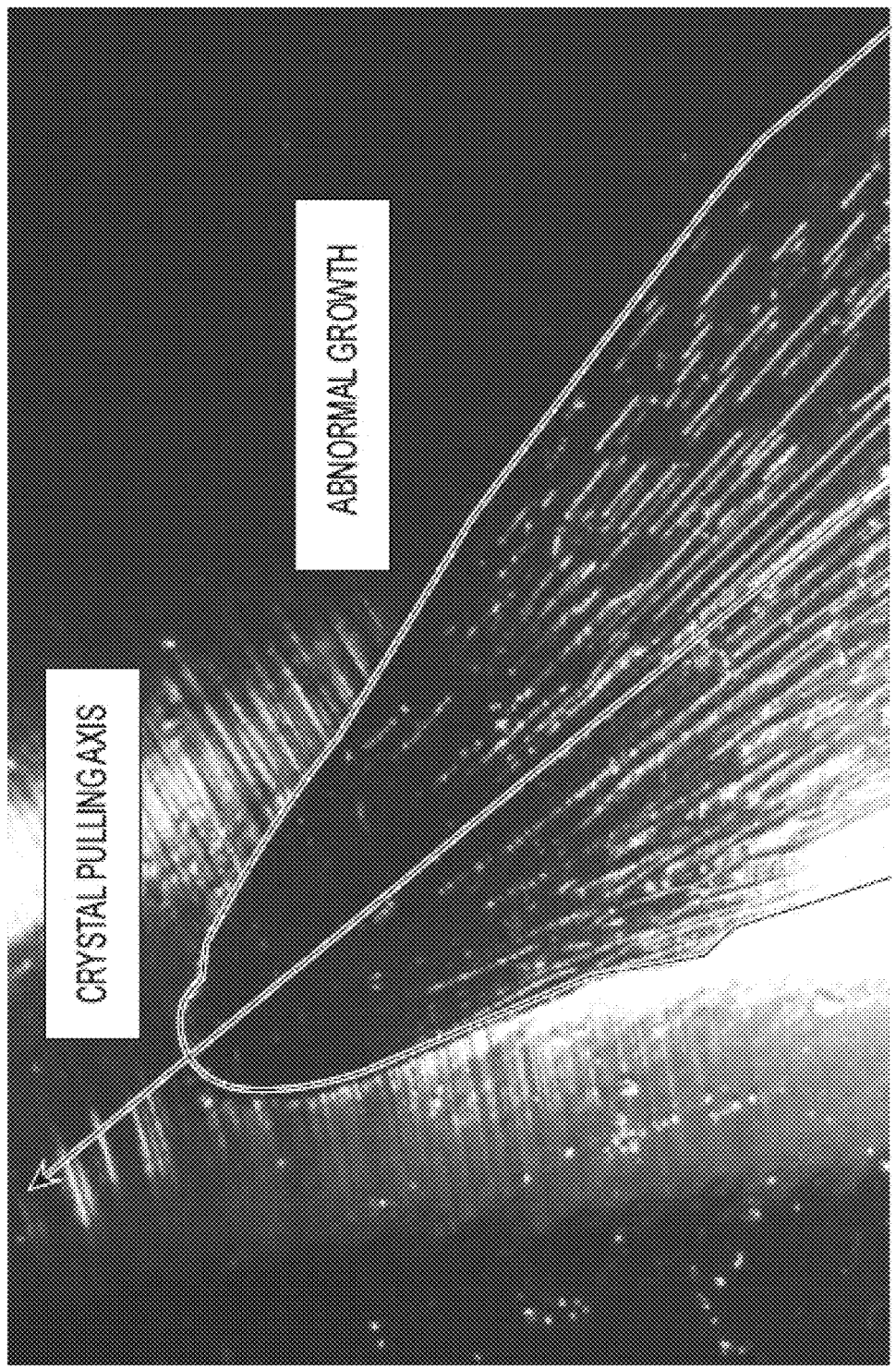
FIG. 2 is a photo of the cross-sectional view of a single crystal ingot that shows formation of abnormal growth.

The particulars shown herein are by way of example and for purposes of illustrative discussion of example features of the present disclosure only and are presented to illustrate what is believed to be the most useful and readily understood description of the principles and conceptual aspects of the example features. In this regard, no attempt is made to show structural details of the example features in more detail than is necessary for the fundamental understanding thereof, the description taken with the drawings making apparent to those skilled in the art how the forms of the example features may be embodied in practice.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the features may be cylindrical, other tubular cross-sectional forms are contemplated, such as square, rectangular, oval, triangular, and others.

In the drawing figures, the dimensions of layers and regions may be exaggerated for clarity of illustration. Like reference numerals refer to like elements throughout. The same reference numbers indicate the same components throughout the specification. Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example features are described herein with reference to cross-sectional illustrations that are schematic illustrations of idealized features (and intermediate structures) of example features. As such, variations from the shapes of the illustrations as a result, for example, of manufacturing techniques and/or tolerances, are to be expected. Thus, example features should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a material and are not intended to limit the scope of example features.

In example features, a method of forming a silicon single crystal includes pulling silicon from a silicon melt to form an ingot. During the pulling process, striation forms at the melt-crystal interface, and, therefore, along the cross-section of the silicon ingot, the striation having a height. A relationship may exist between the striation height and any abnormal growth of the silicon ingot, and between striation height and resistivity of the resulting wafer. In particular, increasing striation height allows for adding more dopant concentration in the silicon melt, and, thereby, to help lower resistivity of the crystal and wafers therefrom.

Figure 3A:
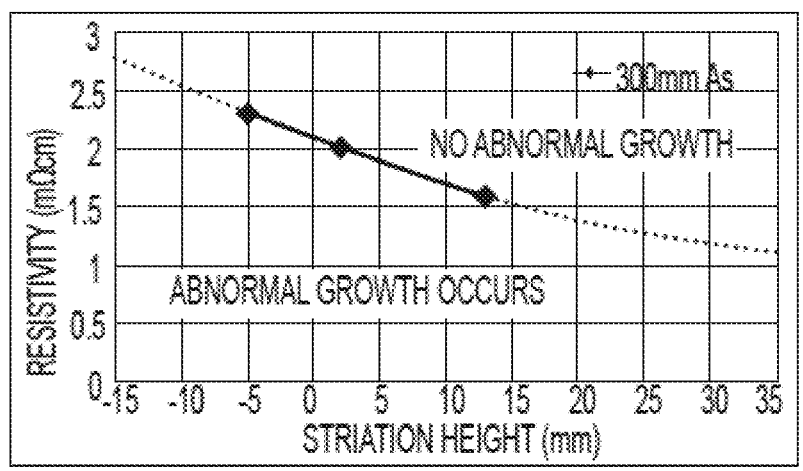
FIGS. 3A-3F illustrate a relationship between striation height and minimum achievable resistivity before abnormal growth occurs according to example features of the present disclosure.
Figure 3B:
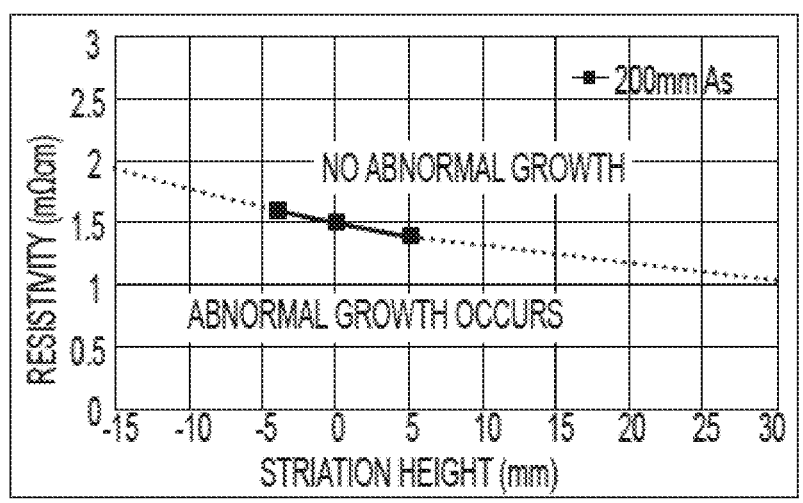
Figure 3C:
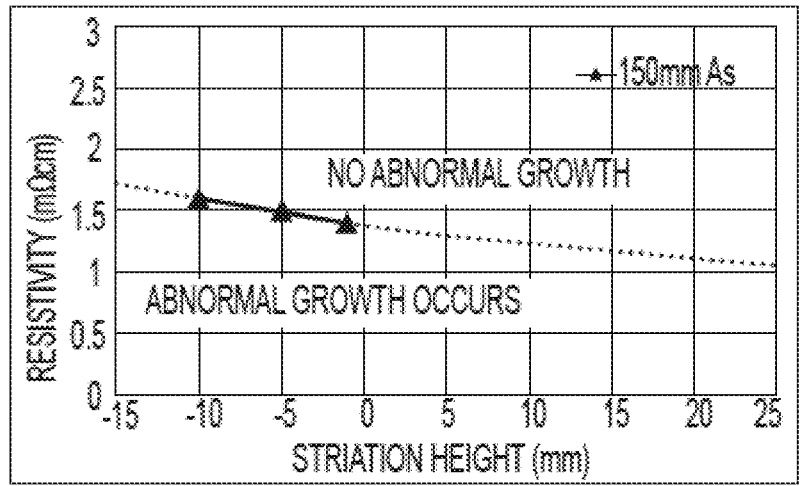

FIGS. 3A-3F illustrate a relationship between striation height and resistivity of silicon wafers for different dopants according to example features of the present disclosure. FIGS. 3A-3C illustrate that arsenic (As) wafers of three different diameters: 150 mm, 200 mm, and 300 mm, all exhibit improved margins for lowering resistivity (without forming abnormal growth) with increasing striation heights. FIG. 3A shows that, for the 300 mm As wafer, a resistivity as low as 1.6 mΩ-cm may be obtained without forming abnormal growth at striation of height of 13 mm according to the present invention. It further shows that resistivity lower than 1.6 mΩ-cm may be possible by further increasing the striation height according to the present invention. Similarly, FIG. 3B shows that, for the 200 mm As wafer, a resistivity as low as 1.4 mΩ-cm may be obtained at striation height of 5 mm. It further shows that resistivity lower than 1.4 mΩ-cm may be obtained by further increasing striation height according to the present invention. Lastly, FIG. 3C shows that, for the 150 mm As wafer, a resistivity as low as 1.4 mΩ-cm may be obtained at striation height of about −1 mm. Again, for all three wafers, lower resistivities are possible without causing abnormal growth by increasing striation heights.

The linearly regressed relationship between the resistivity, expressed as the "Y" axis, and the striation height, expressed as the "X" axis, for each wafer size of the As-doped wafer, is expressed below.

For 300 mm As-doped wafer: $y=2.886\times10^{-6}x^3+3.319\times10^{-4}x^2-4.192\times10^{-2}x+2.082$.

For 200 mm As-doped wafer: $y=-5.514\times10^{-6}x^3+3.872\times10^{-4}x^2-2.216\times10^{-2}x+1.500$.

For 150 mm As-doped wafer: $y=-3.884\times10^{-6}x^3+2.592\times10^{-4}x^2-1.743\times10^{-2}x+1.389$.

Figure 3D:
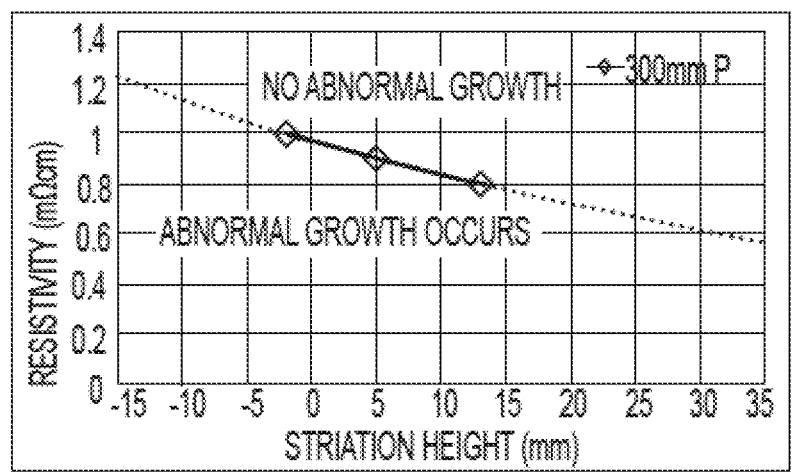
Figure 3E:
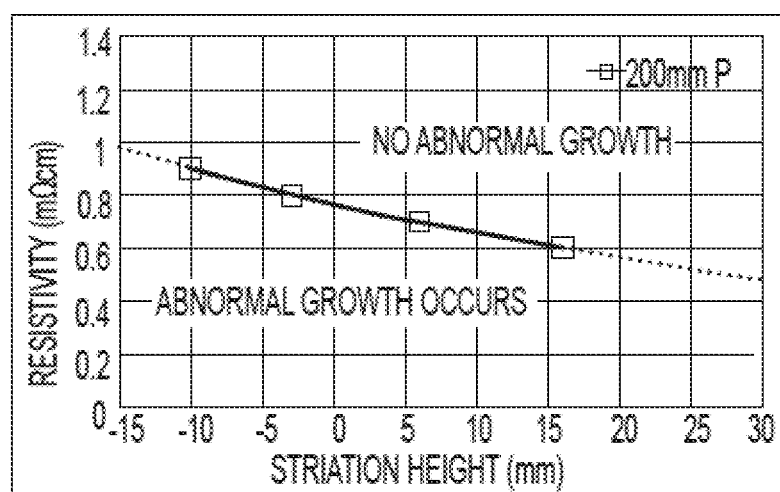
Figure 3F:
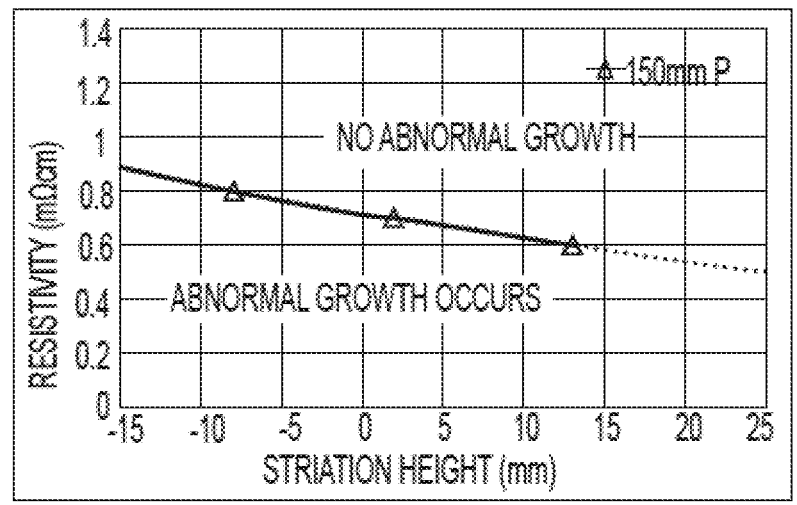
Figure 4B:
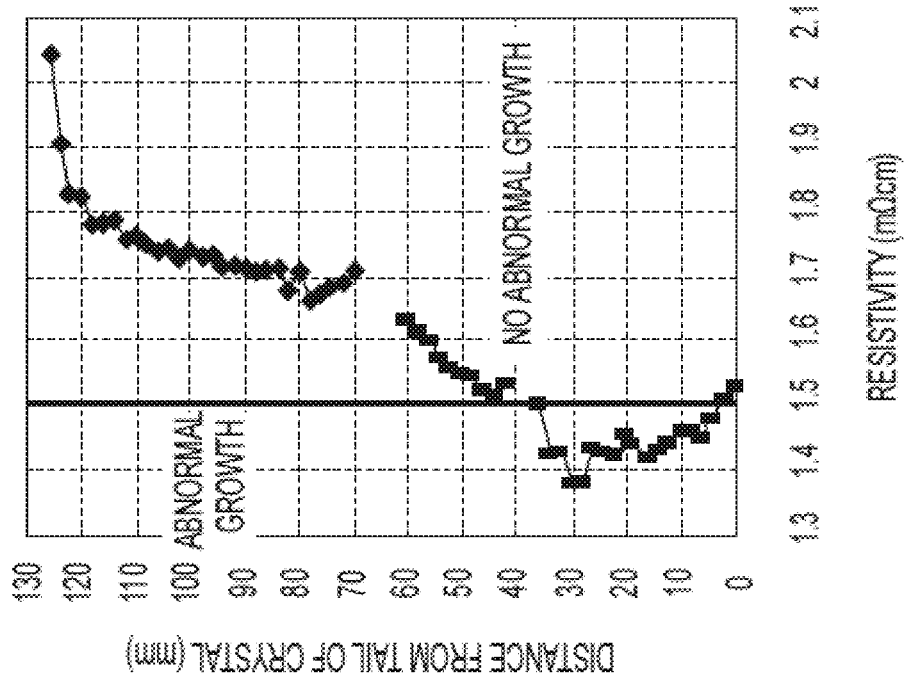
FIGS. 4A and 4B illustrate effectiveness for lowering resistivity in wafers between two dopants.
Figure 4A:
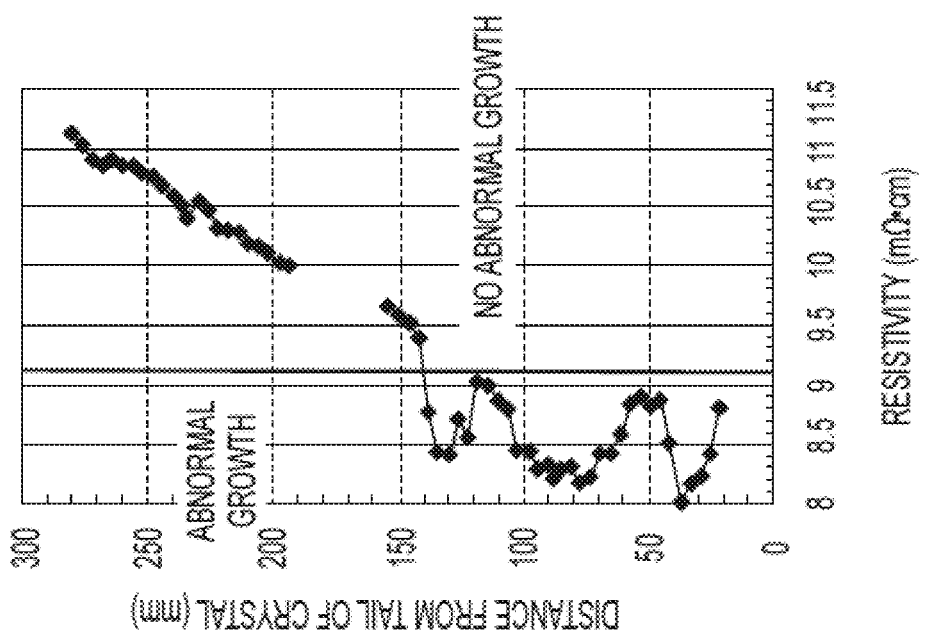

FIGS. 3D-3F illustrate that phosphorous (P) wafers of three different diameters: 150 mm, 200 mm, and 300 mm, all exhibit improved margins for lowering resistivity (without forming abnormal growth) with increasing striation heights. FIG. 3D shows that, for the 300 mm P wafer, a resistivity as low as 0.8 mil-cm may be obtained without forming abnormal growth at striation of height of 13 mm according to the present invention. It further shows that resistivity lower than 0.8 mil-cm may be possible by further increasing the striation height according to the present invention. Similarly, FIG. 3E shows that, for the 200 mm P wafer, a resistivity as low as 0.6 mΩ-cm may be obtained at the striation height of 16 mm. It further shows that resistivity lower than 0.6 mil-cm may be possible by further increasing the striation height according to the present invention. Lastly, FIG. 3F shows that, for the 150 mm P wafer, a resistivity as low as 0.6 mil-cm may be obtained at striation height of about 13 mm. Again, for all three wafers, lower resistivities are possible without causing abnormal growth by increasing striation heights.

The linearly regressed relationship between the resistivity, expressed as the "Y" axis, and the striation height, expressed as the "X" axis, for each wafer size of the P-doped wafer, is expressed below.

For 300 mm P-doped wafer: $y=-1.556\times10^{-6}x^3+1.439\times10^{-4}x^2-1.469\times10^{-2}x+9.700\times10^{-1}$.

For 200 mm P-doped wafer: $y=-1.588\times10^{-6}x^3+1.331\times10^{-4}x^2-1.195\times10^{-2}x+7.649\times10^{-1}$.

For 150 mm P-doped wafer: $y=-1.478\times10^{-6}x^3+7.824\times10^{-5}x^2-9.744\times10^{-3}x+7.176\times10^{-1}$.

The following Table 2 provides numerical evidence of achievable minimum resistivities within the range of striation height for various types of wafers (with fixed dopant concentration).

TABLE 2

| Dopant type | Size | Resistivity (mΩ cm) | Striation height (mm) X-Minimum | Striation height (mm) X-Maximum |
|---|---|---|---|---|
| Arsenic | 300 mm | 2.3 | −5 | 35 |
| | | 2 | 2 | 35 |
| | | 1.6 | 13 | 35 |
| | 200 mm | 1.6 | −4 | 30 |
| | | 1.5 | 0 | 30 |
| | | 1.4 | 5 | 30 |
| | 150 mm | 1.6 | −10 | 25 |
| | | 1.5 | −5 | 25 |
| | | 1.4 | −1 | 25 |
| Phosphorous | 300 mm | 1 | −2 | 35 |
| | | 0.9 | 5 | 35 |
| | | 0.8 | 13 | 35 |
| | 200 mm | 0.9 | −10 | 30 |
| | | 0.8 | −3 | 30 |
| | | 0.7 | 6 | 30 |
| | | 0.6 | 16 | 30 |
| | 150 mm | 0.9 | −16 | 25 |
| | | 0.8 | −8 | 25 |
| | | 0.7 | 2 | 25 |
| | | 0.6 | 13 | 25 |

Figure 5A:
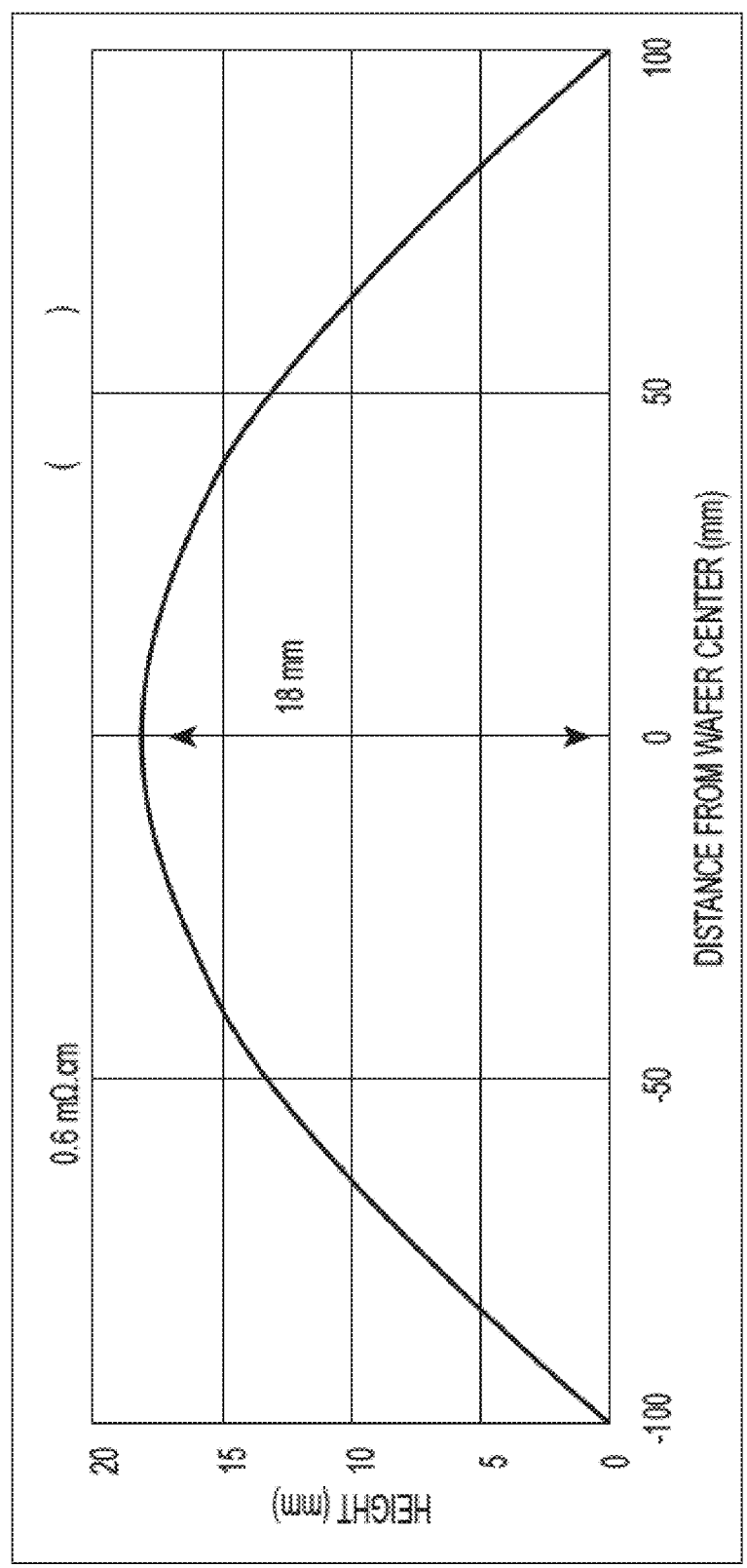
FIGS. 5A and 5B show striation heights for 200 mm and 300 mm wafers, respectively, according to example features of the present disclosure.
Figure 5B:
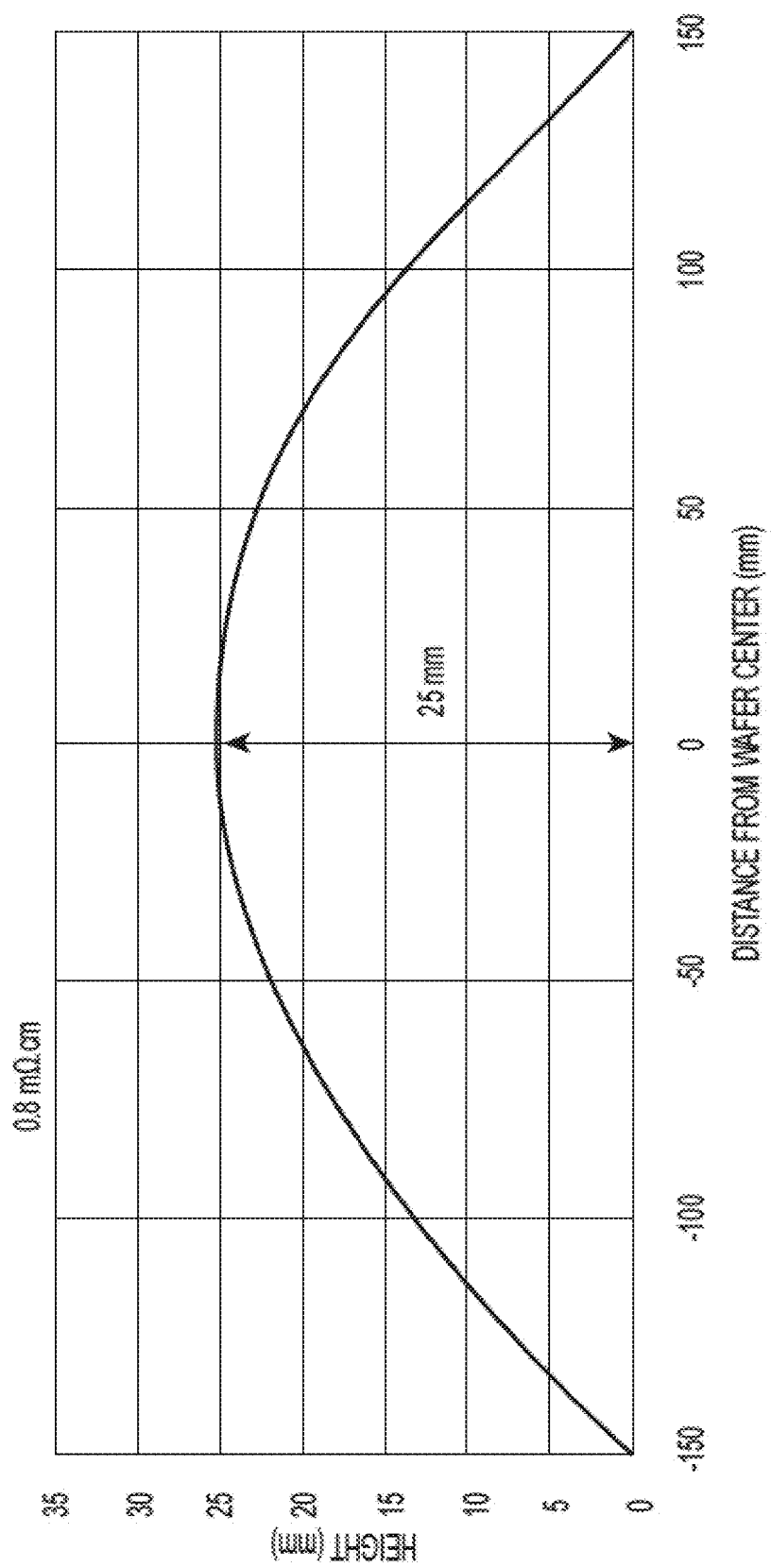

FIGS. 5A and 5B illustrate the measurement of striation heights for 200 mm and 300 mm wafers according to example features of the present disclosure. Both wafers were doped with phosphorous. FIG. 5A shows that a resistivity of about 0.6 mil-cm may be obtained for the 200 mm wafer at a striation height of 18 mm. FIG. 5B shows that a resistivity of 0.8 mil-cm may be obtained for the 300 mm wafer at a striation height of 25 mm. These figures show under the use of the same dopants, that achieving low resistivity appears more difficult for the larger 300 mm wafer than the smaller 200 mm wafer, even with a larger striation height.

Figure 6:
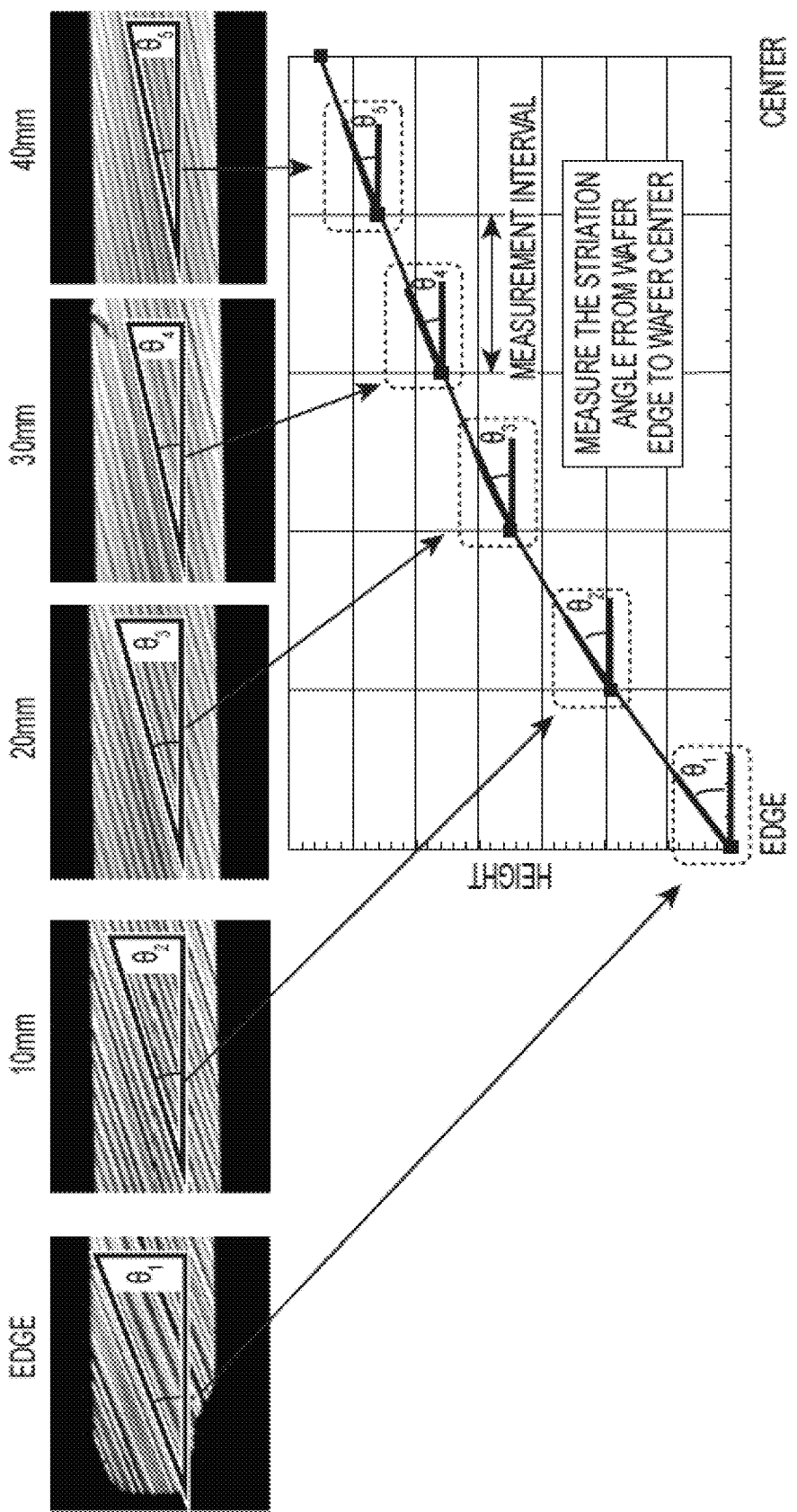
FIG. 6 illustrates a method of measuring striation height in a cross-sectional view of a silicon wafer according to example features of the current disclosure.

FIG. 6 is a graph illustrating a method of measuring striation height on a silicon wafer, according to example features of the current disclosure. In FIG. 6, the striation is measured by first cleaving the wafer and etching the cross section with a combination of, e.g., HF, CrO₃ and H₂O. After etching, photographs of the etched cross-section are taken via, e.g., an optical microscope. Based on the photographs, the striation angle is measured at various intervals, i.e., at 10 mm intervals. The measured striation angle is plotted on a curve where the X-axis represents distance from the edge of the wafer towards the center of the wafer. The resulting curve, as illustrated in FIG. 6, represents the shape and the height of the striation.

Figure 7A:
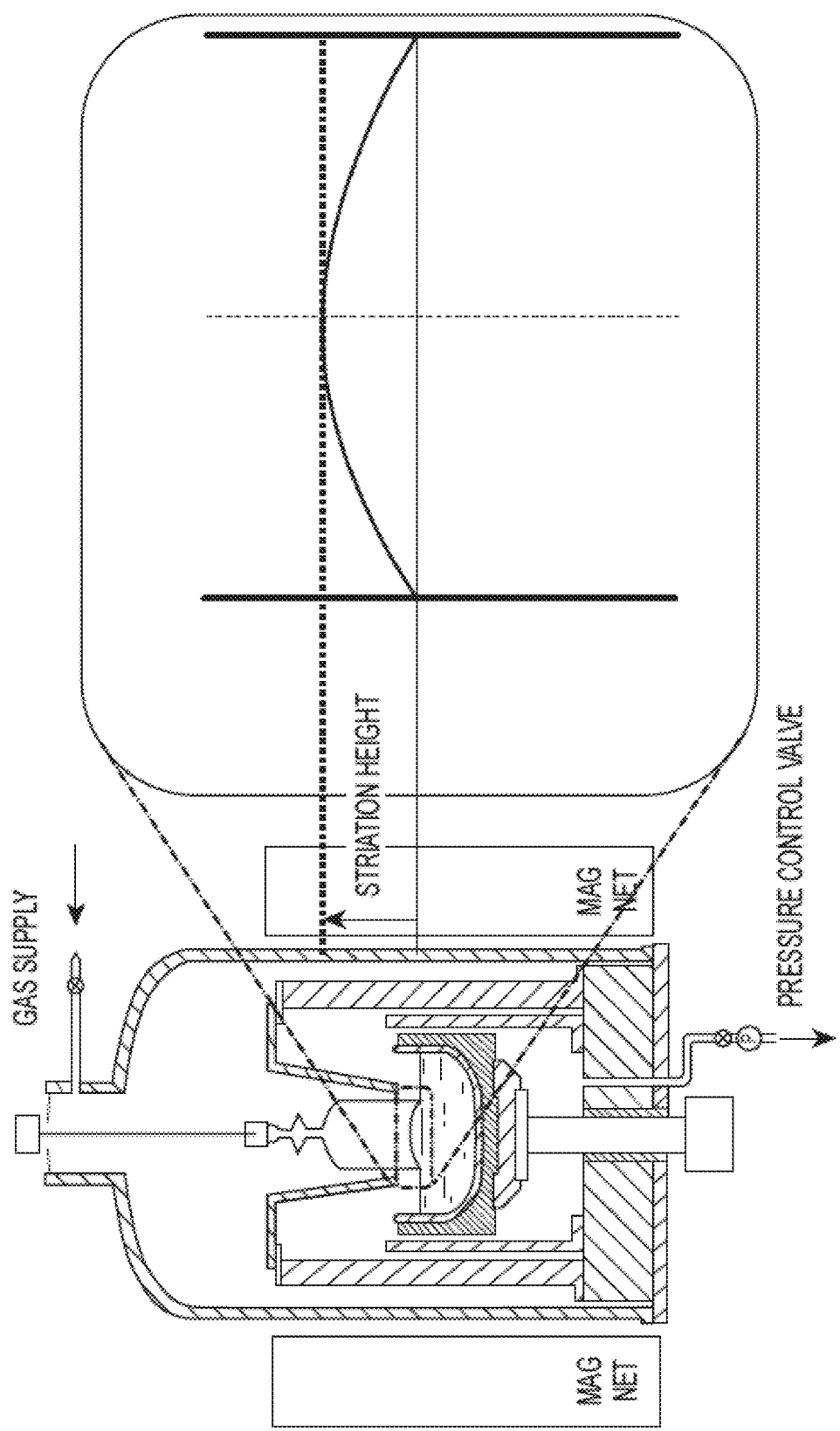
FIGS. 7A and 7B illustrate the formation of positive and negative striation heights, respectively, according to example features.
Figure 7B:
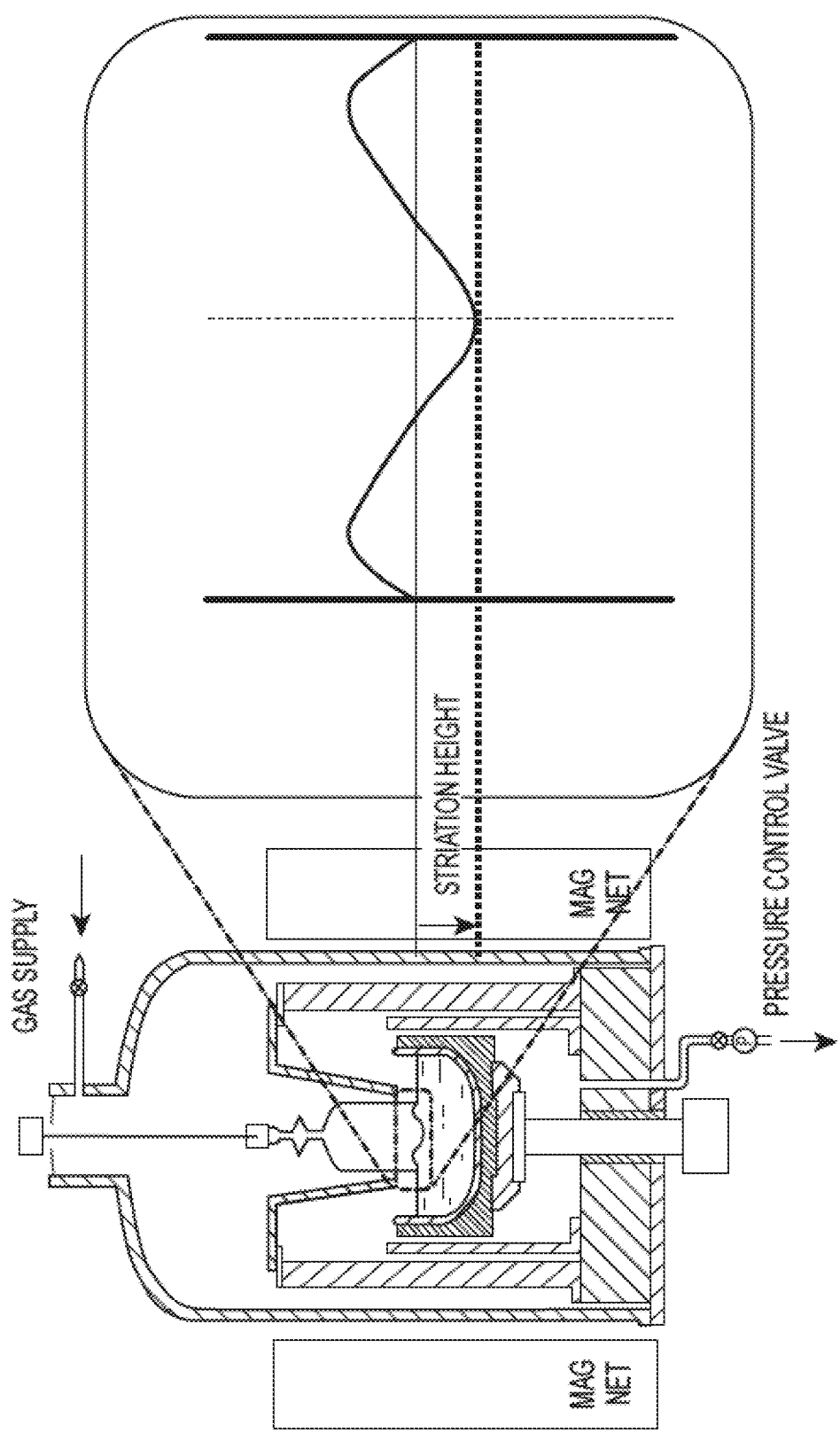

FIGS. 7A and 7B illustrate formation of positive and negative striation heights during the manufacturing process of single-crystal ingots, according to example features. The striation height is illustrative of the height of the solid-liquid interface when the silicon crystal ingot is pulled up from the silicon melt. As shown in FIG. 7A, when the striation height is positive, meaning when the solid-liquid interface is higher than the surface of the silicon melt, the solid-liquid interface is convex. As shown in FIG. 7B, when the striation height is negative, meaning when the solid-liquid interface is lower than the surface of the silicon melt, the solid-liquid interface is concave.

FIGS. 8A and 8B are graphs illustrating a relationship between the magnetic field applied during a manufacturing process of a silicon single crystal wafer and the resulting striation height, according to example features. The single crystal wafer illustrated in FIG. 8A has a size of 300 mm, and the single crystal wafer illustrated in FIG. 8B has a size of 200 mm. The graphs illustrated in FIGS. 8A and 8B show the relationship between the striation height and a magnetic field applied during the pulling process. Among other factors, these figures show that, for both 300 and 200 mm wafers, increasing the magnetic fields increases the striation heights. FIGS. 8A and 8B show how magnetic tend to affect the striation height but were not intended to show lower or upper limits of striation heights in any way. Factors other than magnetic field such as the rotation speeds of the crucible containing the silicon melt, crystal pulling speeds, and dopant concentration amount may further contribute to the varying heights of striation.

Figure 9A:
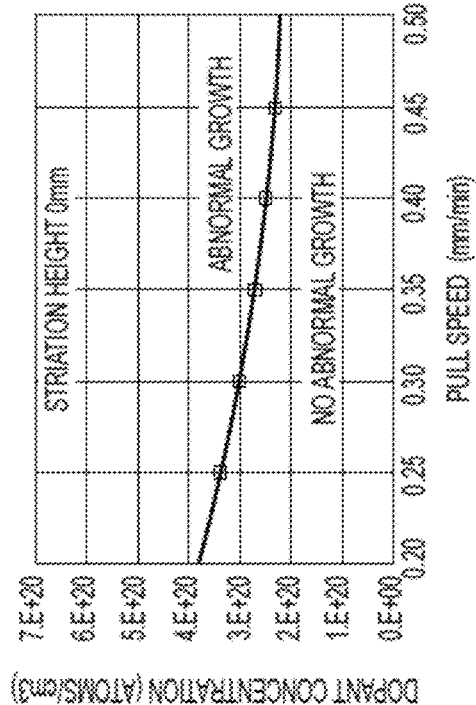
FIGS. 9A-9C illustrate the effect of the pull speed of silicon ingots on the amount of dopant concentration allowable before abnormal growth occurs for various striation heights.
Figure 9B:
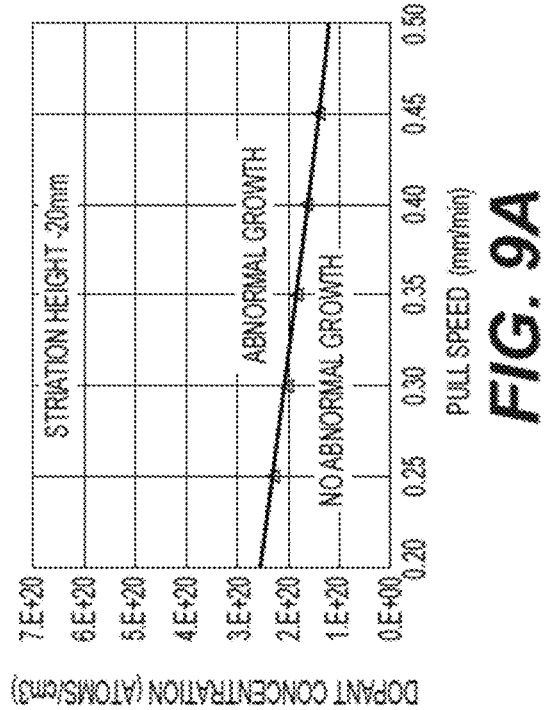
Figure 9C:
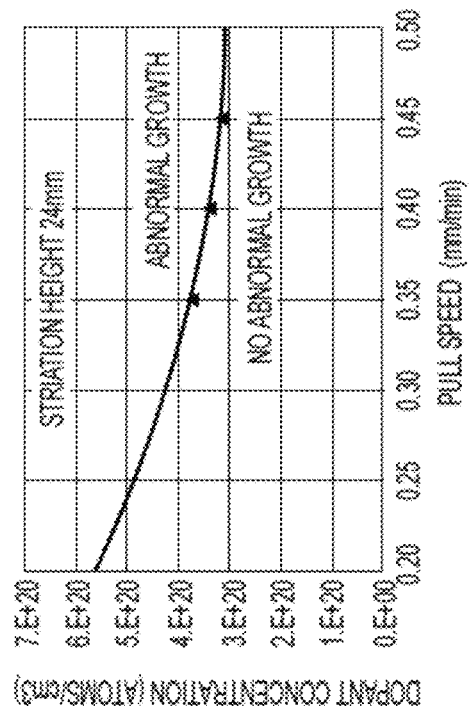
Figure 10A:
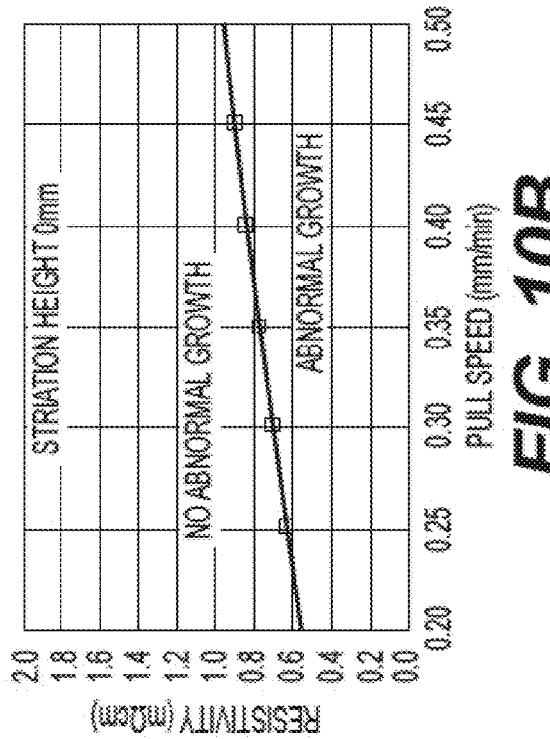
FIGS. 10A-10C illustrate the effect of the pull speed of silicon ingots on lowering resistivity of wafers before abnormal growth occurs for various striation heights.
Figure 10B:
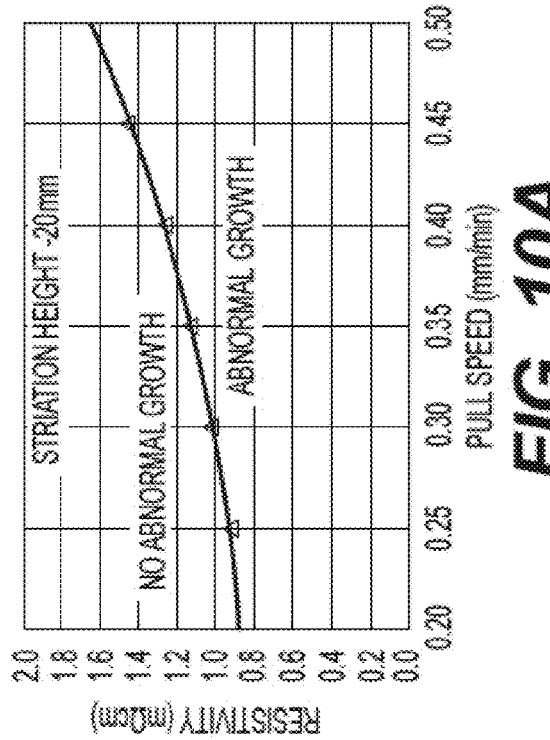
Figure 10C:
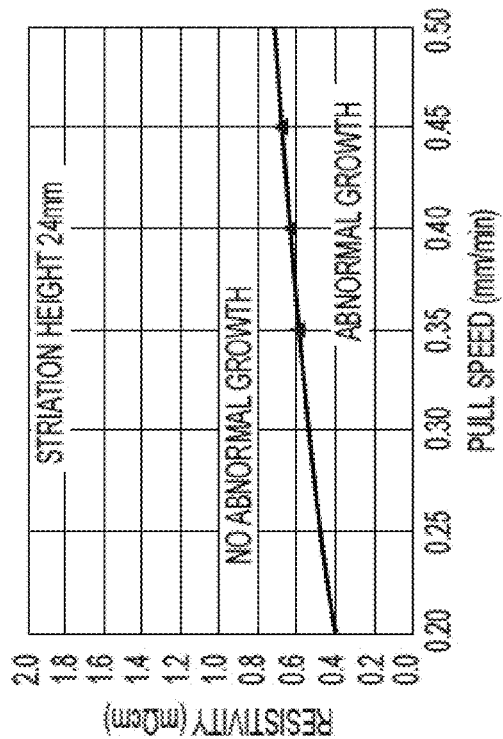

FIGS. 9A-9C and 10A-10C illustrate the effects of the pull speed of the silicon ingot on the dopant concentration and resistivity of wafers, respectively, according to example features. FIGS. 9A-9C and 10A-10C include experiments using wafers of three representative striation heights, 24 mm, 0 mm, and −20 mm. FIGS. 9A-9C show that slower pull speeds afford higher dopant concentration (and therefore lower resistivity) without forming abnormal growth for each of the three striation heights. FIGS. 10A-10C confirm the findings in FIGS. 9A-9C as lowering the pull speeds lowers resistivity for all three striation heights. FIGS. 9A-9C further show that larger striation heights tend to allow higher dopant concentration (therefore lower resistivity) in a wafer at a given pull speed before abnormal growth occurs. Again, FIGS. 10A-10C confirm this as the largest striation case, at 24 mm, demonstrates the lowest resistivity across the range of pull speeds taken in this experiment.

Figure 11:
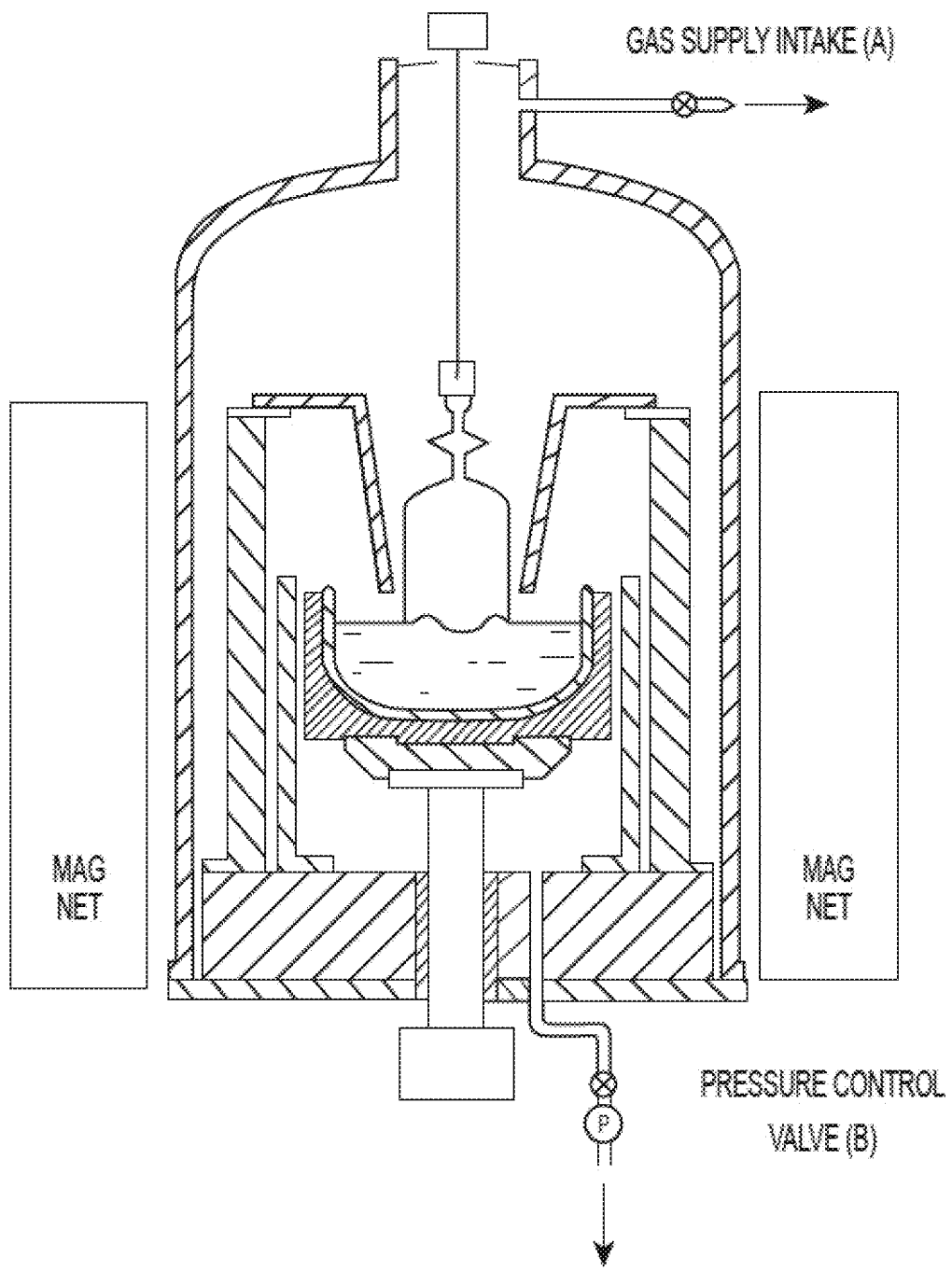
FIG. 11 depicts a crystal pulling apparatus with Gas Supply Intake and Pressure-control Valve.
Figure 12A:
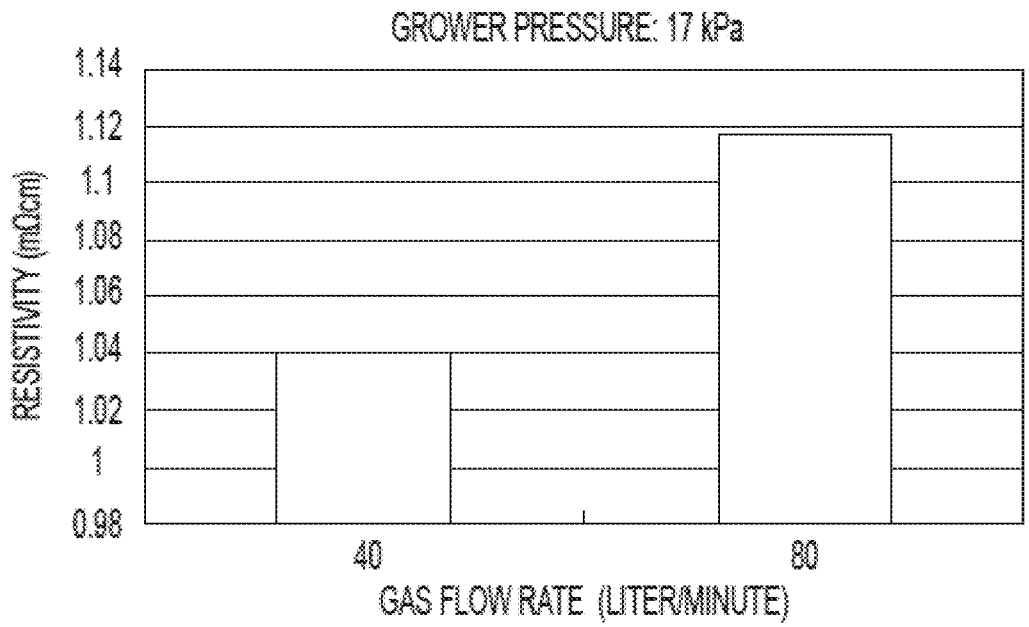
FIG. 12A is a graph showing the relationship between wafer resistivity and gas flow rate.
Figure 12B:
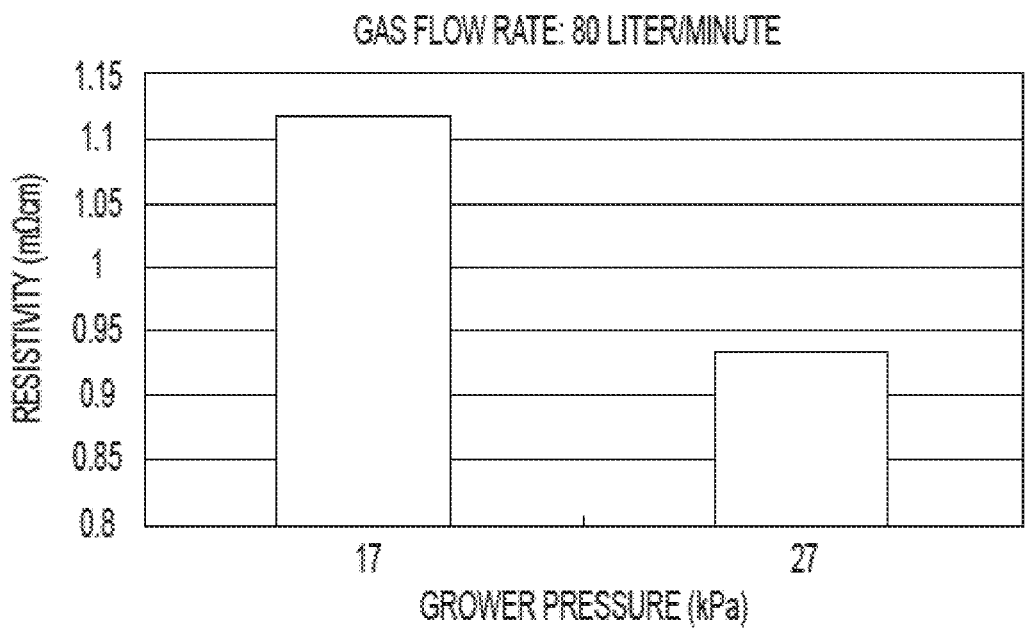
FIG. 12B is a graph showing the relationship between wafer resistivity and gas pressure.

FIG. 11 depicts a crystal pulling apparatus with Gas Supply Intake and Pressure-control Valve. FIGS. 12A and 12B are graphs showing the relationship between resistivity and gas flow rate and gas pressure, respectively. Example features of the present invention include a method of manufacturing a semiconductor wafer, wherein the dopant added to the silicon melt is phosphorus. Example features further include a method of manufacturing a semiconductor wafer that includes applying pressure to the silicon melt (hereinafter "grower pressure") in order to reduce or suppress evaporation of the dopant. In example features, the grower pressure is applied via the application of a gas, such as, e.g., argon. In FIG. 11, the grower pressure can be modulated by controlling the rate of gas flow from the gas supply intake (A). The flow rate may also be controlled from the pressure control valve (B) which releases the gas using a pressure-control valve such as, e.g., butterfly valve. Example features include a method of manufacturing a semiconductor wafer, wherein the resistivity of the wafer is equal to or less than 0.7 mΩ-cm. Suppressing dopant evaporation contributes to lowering wafer resistivity. For example, FIG. 12B shows that increasing pressure (with fixed flow rate at 80 liter/min) from 17 kilopascal (kPa) to 27 kPa reduces the wafer resistivity by about 0.19 mΩ-cm (about 17%). In FIG. 12A, it shows that decreasing the gas flow rate (with fixed gas pressure at 17 kPa) from 80 liter/min to 40 liter/min reduces the wafer resistivity by about 0.08 mΩ-cm (about 7%).

It is noted that the foregoing examples have been provided merely for the purpose of explanation and are in no way to be construed as limiting of the present disclosure. While the present disclosure has been described with reference to exemplary features, it is understood that the words which have been used herein are words of description and illustration, rather than words of limitation. Changes may be made, within the purview of the appended claims, as presently stated and as amended, without departing from the scope and spirit of the present disclosure in its aspects. Although the example features have been described herein with reference to particular structures, materials and features, the example features are not intended to be limited to the particulars disclosed herein; rather, the example features extend to all functionally equivalent structures, methods and uses, such as are within the scope of the appended claims.

The present disclosure is not limited to the above described features, and various variations and modifications may be possible without departing from the scope of the present disclosure.

What is claimed is:

1. A method of making a semiconductor wafer, the method comprising:
   adding a dopant to a silicon melt;
   rotationally pulling a crystal from the silicon melt; and
   applying a magnetic field equal to or more than 3000 G to the silicon melt such that the semiconductor wafer cut from the crystal has a resistivity that is equal to or less than 0.8 mΩ-cm and a striation height that is equal to or more than 13 mm.

2. The method of claim 1, wherein the semiconductor wafer has a diameter of about 300 mm.

3. The method of claim 1, wherein in the dopant comprises phosphorous.

4. The method of claim 1, further comprising applying pressure to the silicon melt to suppress evaporation of the dopant.

5. The method of claim 4, wherein the applying pressure comprises supplying an argon gas to the silicon melt.

6. The method of claim 5, further comprising supplying argon at a flow rate to suppress evaporation of the dopant.

7. The method of claim 1, further comprising applying pressure to the silicon melt to decrease the resistivity of the semiconductor wafer.

8. The method of claim 7, wherein the applying pressure comprises supplying an argon gas to the silicon melt.

9. The method of claim 8, further comprising supplying argon at a flow rate to decrease the resistivity of the semiconductor wafer.

10. The method of claim 1, wherein the resistivity is equal to or less than 0.7 mΩ-cm.

\* \* \* \* \*